United States Patent [19]
Vandermey et al.

[11] 3,988,256

[45] Oct. 26, 1976

[54] PHOTORESIST STRIPPER RINSE

[75] Inventors: John E. Vandermey, Stirling; Harold F. Jones, Dover, both of N.J.; Harold T. Dill, Andover, Mass.

[73] Assignee: Allied Chemical Corporation, Morris Township, N.J.

[22] Filed: Apr. 3, 1974

[21] Appl. No.: 457,337

[52] U.S. Cl. ............................. 252/171; 134/38; 134/42; 252/DIG. 9; 252/DIG. 14
[51] Int. Cl.² ........................................... C23G 5/02
[58] Field of Search ........ 252/171, DIG. 14, DIG. 9; 134/38, 42

[56] References Cited
UNITED STATES PATENTS

| | | | |
|---|---|---|---|
| 3,338,756 | 8/1967 | Leon | 148/6.15 |
| 3,600,322 | 8/1971 | Morison | 252/171 |
| 3,737,386 | 6/1973 | Geiss et al. | 252/171 |
| 3,789,007 | 1/1974 | Robinson | 252/171 |

*Primary Examiner*—Mayer Weinblatt
*Attorney, Agent, or Firm*—Anthony J. Stewart

[57] ABSTRACT

A process for removing a photoresist stripper from a substrate comprising rinsing the substrate with a composition comprising from about 65 to about 98.5 weight percent methylene chloride and from about 1.5 to about 35 weight percent of an alcohol selected from the group consisting of isopropanol, tertiary butanol and mixtures thereof.

4 Claims, No Drawings

PHOTORESIST STRIPPER RINSE

During manufacture of semiconductors or semiconductor microcircuits, it is frequently necessary to coat materials, e.g. silicon or silicon dioxide wafers, from which the semiconductors and microcircuits are manufactured, with a polymeric organic substance which is generally a photoresist, i.e. a substance which forms an etch resist upon exposure to light. Subsequently the polymeric organic substance must be removed. Products for removal of organic substances such as photoresist strippers may contain a strong oxidizing agent such as chromic acid or are organic strippers which contain components having superior dissolving characteristics such as ketones, phenols, halogenated hydrocarbons, sulfonic acids and carboxylic acids.

After the photoresist is dissolved by the stripper, it is necessary to completely remove both the stripper and residual photoresist from the material from which the semiconductor or semiconductor microcircuit is being manufactured.

Prior art products for rinsing strippers and residual photoresist from the materials have one or more disadvantages. The rinsing product or composition is frequently unsatisfactory in that even after rinsing with the composition residual products remain upon the surface of the material, the composition is frequently toxic, and is frequently flammable due to high concentrations of flammable alcohol. Prior to this invention an efficient process for rinsing a photoresist stripper from a substrate with a composition having low toxicity and low flammability was not available.

BRIEF DESCRIPTION OF THE INVENTION

In accordance with this invention a process for rinsing a photoresist stripper from a substrate is provided which is highly efficient and utilizes a composition having relatively low toxicity and low flammability. The process for rinsing a photoresist stripper from a substrate comprises rinsing the substrate with a composition comprising from about 65 to about 98.5 weight percent methylene chloride and from and 1.5 to about 35 percent of an alcohol selected from the group consisting of isopropanol and tertiary butanol and mixtures thereof. The composition utilized in the process has an acceptable flash point even at alcohol concentrations as high as 35 weight percent, and methylene chloride has relatively low toxicity when compared with carbon tetrachloride, a chlorinated hydrocarbon frequently utilized in the prior art for elevating flash points of alcohols. Similarly isopropanol and tertiary butanol have relatively low toxicity when compared with methanol, an alcohol disclosed in the prior art as utilizable in conjunction with methylene chloride for stripping photoresists. In addition it has been unexpectedly found that lower concentrations of isopropanol and tertiary butanol are required for efficient removal of the stripper than when methanol or ethanol are used. The lower concentration of alcohol is desirable in that flammability is even further reduced. In general the use of ethanol is to be avoided due to its strict governmental regulation as an ingestable alcohol.

DETAILED DESCRIPTION OF THE INVENTION

In accordance with this invention there is provided a process for rinsing a photoresist stripper from a substrate comprising rinsing the substrate with a composition comprising from about 65 to about 98.5 weight percent methylene chloride and from about 1.5 to about 35 weight percent of an alcohol selected from the group consisting of isopropanol, tertiary butanol and mixtures thereof.

The photoresist stripper which is removed may contain dissolved photoresist and generally contains an oxidizing agent such as chromic acid or one or more organic compounds which in combination have high solvency for photoresist resins. Examples of such organic compounds are ketones, halogenated hydrocarbons, aromatic solvents such as toluene and phenol, acids such as aryl sulfonic acids or acetic acid and surface active agents such as alkyl aryl sulfonic acids.

The substrate from which the photoresist stripper is removed may be any material encountered in the electrical or electronics arts but is generally a semiconductor material containing silicon or germanium. The usual substrate is silicon or silicon dioxide.

The photoresist stripper may be removed from the substrate by rinsing the substrate with a composition as disclosed herein. The rinsing may be done in any suitable way such as by spraying or by immersing the substrate into the composition with or without movement of the substrate relative to the composition during immersion. When agitation is not employed during immersion, the photoresist stripper is generally removed by the composition in from about 10 seconds to about two minutes. When agitation is employed the photoresist stripper is generally removed from the substrate in less than one minute.

The preferred percentage of methylene chloride in the composition used for rinsing the photoresist stripper from the substrate is from about 65 to about 98.5 weight percent. Most preferably the percentage of methylene chloride in the composition is from about 73 to about 95 weight percent.

While the use of any lower alcohol through tertiary butanol has been found to be effective in conjuction with methylene chloride, isopropyl alcohol and tertiary butanol have been found to be superior, in that lower concentrations of isopropanol and tertiary butanol are required for fast efficient removal of the photoresist stripper from the substrate. In addition the use of isopropanol or tertiary butanol results in lower toxicity than when methanol is utilized and the flammability of the composition used for rinsing the substrate is substantially lower when isopropanol and tertiary butanol are used than the flammability of similar compositions incorporating methanol or ethanol. The preferred concentration of isopropanol or tertiary butanol is between about 1.5 and about 35 weight percent of the composition. The most preferred concentration of isopropanol or tertiary butanol is between about 5 and about 27 weight percent since the most rapid and efficient removal of the photoresist stripper from the substrate occurs when the percentage of alcohol contained in the composition is within the most preferred range.

While tertiary butanol is a preferred alcohol for use in conjunction with methylene chloride in rinsing photoresist stripper from the substrate, isopropanol is most preferred in that it evaporates more readily from the surface of the substrate after rinsing.

In the following examples, percentages and parts are by weight unless otherwise indicated. The following examples illustrate the superior removal of photoresist stripper from a silicon substrate when a composition comprising methylene chloride and an alcohol selected from isopropanol and tertiary butanol is used. The examples clearly indicate that the composition containing methylene chloride and either isopropanol or tertiary butanol results in superior removal of photoresist stripper from the substrate than when other solvents are used alone and than when methylene chloride is used with methyl alcohol rather than isopropanol or tertiary butanol.

EXAMPLES 1 – 23

A series of silicon wafers are immersed in a photoresist stripper comprising an alkyl aryl sulfonic acid, phenol, aryl sulfonic acid and perchloroethylene. The wafers are then removed from the stripper and immersed with agitation for thirty seconds in various organic solvent compositions to determine the effectiveness of the solvent compositions in removing the stripper from the wafer. The effectiveness of removal is determined by visual observation. The effectiveness is characterized as very good if no visible film remains on the wafer within three seconds after the wafer is removed from the solvent composition. The effectiveness is characterized as good if no visible film of liquid remains on the surface of the wafer ten seconds after the wafer is removed. The effectiveness is characterized as fair if a thin film of liquid remains on the surface of the wafer ten seconds after the wafer is removed and the effectiveness is characterized as poor if a readily visible layer of liquid remains on the surface of the wafer ten seconds after the wafer is removed.

The solvent compositions used and the observed results are set out in Table I. A comparision of the results clearly indicates that the use of a composition comprising methylene chloride in conjuction with either isopropanol or tertiary butanol gives the best results at the desirable lower alcohol concentrations.

TABLE I

| EXAMPLE | SOLVENT COMPOSITION | EFFECTIVENESS |
|---|---|---|
| 1 | 1,1,1 trichloroethane | Fair |
| 2 | 1,1,2 trichloroethane | Poor |
| 3 | trichloroethylene | Fair |
| 4 | perchloroethylene | Poor |
| 5 | methylene chloride | Poor |
| 6 | methanol | Fair |
| 7 | isopropanol | Fair |
| 8 | tertiary butanol | Fair |
| 9 | 98.5% methylene chloride 1.5% methanol | Fair |
| 10 | 95% methylene chloride 5% methanol | Fair |
| 11 | 94% methylene chloride 6% methanol | Fair |
| 12 | 90% methylene chloride 10% methanol | Good |
| 13 | 80% methylene chloride 20% methanol | Very Good |
| 14* | 50% methylene chloride 50% methanol | Fair to Good |
| 15 | 98.5% methylene chloride 1.5% isopropanol | Fair to Good |
| 16 | 95% methylene chloride 5% isopropanol | Very Good |
| 17 | 73% methylene chloride 27% isopropanol | Very Good |
| 18 | 64% methylene chloride 36% isopropanol | Good |
| 19 | 98% methylene chloride 2% tertiary butanol | Good |
| 20 | 94% methylene chloride 6% tertiary butanol | Very Good |
| 21 | 90% methylene chloride 10% tertiary butanol | Very Good |

TABLE I-continued

| EXAMPLE | SOLVENT COMPOSITION | EFFECTIVENESS |
|---|---|---|
| 22 | 80% methylene chloride 20% tertiary butanol | Very Good |
| 23** | 50% methylene chloride 50% tertiary butanol | Fair to Good |

*Flash point about 45° F
**Flash point about 68° F

EXAMPLES 24 – 33

In order to demonstrate that the process of the invention is efficient even when the solvent composition is contaminated with photoresist stripper, 6 grams of the photoresist stripper used in Examples 1 – 23 is introduced into 120 ml of solvent composition. 12 silicon wafers are then immersed in the solvent composition. The wafers are then removed from the solvent composition and permitted to dry for 5 seconds. The wafers are then rinsed in clean isopropanol for 30 seconds, the isopropanol is evaporated and the residue is weighed. Greater efficiency of removal is indicated by the lower weights of residue.

The following Table II indicates the solvent composition used and the amount of residue carried from the solvent by the wafers. The results clearly indicate that the use of methylene chloride-isopropanol chloride-tertiary methylene chloridetertiary butanol solvent compositions result in less residue indicating a higher rinsing efficiency.

TABLE II

| EXAMPLE | SOLVENT COMPOSITION | RESIDUE |
|---|---|---|
| 24 | methylene chloride | 0.0257 g. |
| 25 | isopropanol | 0.0393 g. |
| 26 | methanol | 0.0267 g. |
| 27 | trichloroethylene | 0.0278 g. |
| 28 | 98% methylene chloride 2% methanol | 0.0227 g. |
| 29 | 94% methylene chloride 6% methanol | 0.0217 g. |
| 30 | 98% methylene chloride 2% isopropanol | 0.0181 g. |
| 31 | 96% methylene chloride 4% isopropanol | 0.0108 g. |
| 32 | 98% methylene chloride 2% tertiary butanol | 0.0207 g. |
| 33 | 94% methylene chloride 6% tertiary butanol | 0.0100 g. |

What is claimed is:

1. A process for removing a photoresist stripper from a substrate consisting essentially of rinsing the substrate with a composition which consists essentially of from about 65 to about 98.5 weight percent methylene chloride and from about 1.5 to about 35 weight percent of an alcohol selected from the group consisting of isopropanol, tertiary butanol and mixtures thereof.

2. The process of claim 1 wherein the substrate is silicon or silicon dioxide and the composition comprises from about 73 to about 95 weight percent methylene chloride and from about 5 to about 27 weight percent of said alcohol.

3. The process of claim 2 wherein the alcohol is isopropanol.

4. The process of claim 2 wherein the alcohol is tertiary butanol.

* * * * *

UNITED STATES PATENT AND TRADEMARK OFFICE
CERTIFICATE OF CORRECTION

PATENT NO. : 3,988,256
DATED      : October 26, 1976
INVENTOR(S) : John E. VanderMey, Harold F. Jones and Harold T. Dill It is certified that error appears in the above-identified patent and that said Letters Patent are hereby corrected as shown below:

Col. 1, line 42, "from and" should read -- from about --

Col. 1, line 43, "35 percent" should read -- 35 weight percent --

Col. 4, line 27, "chloride-isopropanol chloride-tertiary methylene chloridetertiary butanol" should read -- chloride-isopropanol and methylene chloride-tertiary butanol --

Col. 4, line 55, "composition comprises from" should read

-- composition consists essentially of from --

Signed and Sealed this

Tenth Day of May 1977

[SEAL]

Attest:

RUTH C. MASON
Attesting Officer

C. MARSHALL DANN
Commissioner of Patents and Trademarks